(12) United States Patent
Choi et al.

(10) Patent No.: US 9,666,454 B2
(45) Date of Patent: May 30, 2017

(54) WAFER STORAGE APPARATUS HAVING GAS CHARGING PORTIONS AND SEMICONDUCTOR MANUFACTURING APPARATUS USING THE SAME

(71) Applicant: SAMSUNG ELECTRONICS CO., LTD., Suwon-si, Gyeonggi-Do (KR)

(72) Inventors: In-Ho Choi, Suwon-si (KR); Young-Suk Sim, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 114 days.

(21) Appl. No.: 14/579,609

(22) Filed: Dec. 22, 2014

(65) Prior Publication Data

US 2015/0206780 A1 Jul. 23, 2015

(30) Foreign Application Priority Data

Jan. 22, 2014 (KR) ........................ 10-2014-0007936

(51) Int. Cl.
*H01L 21/67* (2006.01)
*H01L 21/673* (2006.01)

(52) U.S. Cl.
CPC .... *H01L 21/67017* (2013.01); *H01L 21/6732* (2013.01); *H01L 21/67309* (2013.01); *Y10T 29/49826* (2015.01)

(58) Field of Classification Search
CPC ......... H01L 21/67017; H01L 21/67309; H01L 21/6732; H01L 21/67386; H01L 21/67369; H01L 21/67373

USPC ............ 141/65, 98; 414/217.1; 206/710–712
See application file for complete search history.

(56) References Cited

U.S. PATENT DOCUMENTS

| | | | | |
|---|---|---|---|---|
| 5,879,458 A | * | 3/1999 | Roberson, Jr. | .... H01L 21/67017 118/715 |
| 6,267,158 B1 | * | 7/2001 | Saga | .................. H01L 21/67253 141/65 |
| 6,364,922 B1 | * | 4/2002 | Tanaka | ............... H01L 21/67772 206/710 |
| 6,899,145 B2 | * | 5/2005 | Aggarwal | ......... H01L 21/67393 141/11 |
| 7,314,068 B2 | * | 1/2008 | Nakano | ............. H01L 21/67017 141/66 |
| 8,028,978 B2 | * | 10/2011 | Nelson | .............. H01L 21/67754 118/728 |
| 8,544,651 B2 | | 10/2013 | Zhang et al. | |

(Continued)

FOREIGN PATENT DOCUMENTS

JP 2003-318254 11/2003
KR 1999-0024880 7/1999

(Continued)

*Primary Examiner* — Timothy L Maust
(74) *Attorney, Agent, or Firm* — F. Chau & Associates, LLC

(57) ABSTRACT

A wafer storage apparatus includes a wafer stacking portion that encloses an internal space with an open front side for receiving a plurality of wafers; a rear cover portion disposed on the back side of the wafer stacking portion; and a gas charging portion that includes a plurality of gas supply blocks disposed on the inner side of the rear cover portion, a plurality of gas supply pipes connected to the gas supply blocks via through holes in the rear cover portion, and a gas supply unit connected to the gas supply pipes.

17 Claims, 13 Drawing Sheets

(56) References Cited

U.S. PATENT DOCUMENTS

| | | | |
|---|---|---|---|
| 9,054,144 B2 * | 6/2015 | Burns | ............... H01L 21/67376 |
| 2009/0226283 A1 | 9/2009 | Ovrelid et al. | |
| 2010/0175781 A1 | 7/2010 | Kisakibaru et al. | |
| 2010/0282272 A1 | 11/2010 | Godot et al. | |
| 2013/0121851 A1 | 5/2013 | Kim | |

FOREIGN PATENT DOCUMENTS

| | | |
|---|---|---|
| KR | 10-2001-0020967 | 3/2001 |
| KR | 10-2006-0127294 | 12/2006 |
| KR | 10-2008-0060781 | 7/2008 |
| KR | 10-2010-0038382 | 4/2010 |
| KR | 10-2010-0075837 | 7/2010 |
| KR | 10-0989887 | 10/2010 |
| KR | 10-2011-0041445 | 4/2011 |
| KR | 10-2011-0082833 | 7/2011 |
| KR | 10-1075171 | 10/2011 |
| KR | 10-1171218 | 8/2012 |
| KR | 10-2013-0052490 | 5/2013 |
| KR | 10-1266131 | 5/2013 |
| KR | 10-2013-0085901 | 7/2013 |

* cited by examiner

WAFER STORAGE APPARATUS HAVING GAS CHARGING PORTIONS AND SEMICONDUCTOR MANUFACTURING APPARATUS USING THE SAME

CROSS-REFERENCE TO RELATED APPLICATIONS

This application claims priority under 35 U.S.C. §119 from Korean Patent Application No. 10-2014-0007936, filed on Jan. 22, 2014 in the Korean Intellectual Property Office, and all the benefits accruing therefrom, the contents of which are herein incorporated by reference in their entirety.

BACKGROUND

Embodiments of the inventive concept are directed to a wafer storage apparatus and a semiconductor manufacturing apparatus using the same, and more particularly, to a wafer storage apparatus including a gas charging portion and a semiconductor manufacturing apparatus using the apparatus.

Semiconductor devices may be manufactured by various manufacturing processes, such as a thin film forming process, a photo process, an etching process, etc. A wafer storage apparatus in which wafers are stacked may be used during a semiconductor manufacturing process. The wafer storage apparatus is used to prevent wafer contamination due to a gas or moisture, which is generated after a process is performed, remaining in the wafer during the manufacturing process.

SUMMARY

Embodiments of the inventive concept may provide a wafer storage apparatus capable of reducing wafer contamination due to a residual gas or moisture which flows thereinto during a semiconductor manufacturing process.

Embodiments of the inventive concept may also provide a semiconductor manufacturing apparatus using the above-described wafer storage apparatus.

According to an embodiment of the inventive concept, there is provided a wafer storage apparatus that includes a wafer stacking portion enclosing an internal space with an open front side for receiving a plurality of wafers; a rear cover portion disposed on a back side of the wafer stacking portion; and a gas charging portion that includes a plurality of gas supply blocks disposed on the inner side of the rear cover portion, a plurality of gas supply pipes connected to the gas supply blocks via through holes in the rear cover portion, and a gas supply unit connected to the gas supply pipes.

The wafer stacking portion may include holders disposed on both sides of the internal space, each holder may include a plurality of parallel slits for receiving ends of wafers being inserted thereinto, separating wafers from each other and stacking wafers parallel to each other. The wafer stacking portion may include an upper cover and a bottom plate in upper and lower portions of the holder, respectively. The gas supplying blocks may be bars on an inner front surface of the rear cover portion that extend from a bottom plate of the wafer stacking portion toward the upper cover. The wafer stacking portion may include a cover support base that supports the upper cover on the bottom plate. The rear cover portion may shield the holder from the outside and to prevent air from flowing into the internal space.

The wafer storage apparatus may include a vertical support frame disposed on the lower side of the wafer stacking portion for supporting the wafer stacking portion, and a gas inflow pipe and a gas discharging pipe disposed inside and outside the vertical supporting frame, respectively.

The wafer storage apparatus may include a humidity sensor disposed within the wafer stacking portion.

The gas inflow pipe may include a gas supply valve, and the gas discharging pipe may include a gas discharging valve. The wafer storage apparatus may include a driving control unit that may compare a humidity value detected by the humidity sensor with a reference humidity value, transmit a first control signal to the gas supply valve gas to control gas flow into the wafer stacking portion, and transmit a second control signal to the gas discharging valve to control the exhaust gas being expelled from the wafer stacking portion The gas supplying blocks may be disposed on an inner side of the rear cover portion, on a left side of a center of the rear cover portion, and on the right side of the center, respectively.

The gas supplying block may include: a body portion, a gas flow line formed within the body portion, and a plurality of gas spraying units connected to the gas flow line. Each of the gas spraying units may include a plurality of spraying holes to spray gas in a plurality of directions.

The wafer storage apparatus may further include a load port portion comprising a wafer container in which a plurality of wafers are stacked; an equipment front end module comprising a transfer robot for transferring the wafers within the wafer container to a manufacturing process equipment or transferring the wafers to the wafer container from the manufacturing process equipment; and a load lock chamber in a front end portion thereof for transferring just-manufactured wafers to the wafer storage apparatus. The wafer storage apparatus may be positioned on one side of the equipment front end module for transferring just-manufactured wafers from the manufacturing process equipment and stacking wafers by using the transfer robot.

According to another embodiment of the inventive concept, there is provided a wafer storage apparatus that includes a wafer stacking portion enclosing an internal space with an open front side for receiving a plurality of wafers and including holders disposed on both sides of the internal space, an upper cover, and a bottom plate in upper and lower portions of the holders; a rear cover portion disposed on a back side of the wafer stacking portion; and a gas charging portion for injecting gas into the wafer stacking portion from the back side on which the rear cover portion is provided.

Each holder may include a plurality of parallel slits configured to receive ends of wafers being inserted thereinto, to separate wafers from each other and to stack the wafers parallel to each other.

The wafer storage apparatus may further include a vertical supporting frame provided on the lower side of the wafer stacking portion configured to support the wafer stacking portions; and a gas inflow pipe and a gas discharging pipe are provided inside and outside the vertical supporting frame, respectively.

The gas supply pipes may include a gas supply valve and the gas discharging pipe may include a gas discharging valve. The wafer storage apparatus may further include a humidity sensor disposed within the wafer stacking portion; and a driving control unit. The driving control unit may compare a humidity value detected by the humidity sensor with a reference humidity value, transmit a first control signal to the gas supply valve gas to control gas flow into the wafer stacking portion, and transmit a second control signal to the gas discharging valve to control exhaust gas being expelled from the wafer stacking portion.

The gas charging portion may include a plurality of gas supply blocks provided on the inner side of the rear cover portion, a plurality of gas supply pipes connected to the gas supply blocks via through holes in the rear cover portion, and a gas supply unit connected to the gas supply pipes.

The gas supply blocks may be bars disposed on an inner front surface of the rear cover portion that extend from a bottom plate of the wafer stacking portion toward the upper cover.

The gas supply block may include a body portion, a gas flow line formed within the body portion, and a plurality of gas spraying units connected to the gas flow line. Each of the gas spraying units may be provided with a plurality of spraying holes so as to spray gas in a plurality of directions.

According to another embodiment of the inventive concept, there is provided a process of assembling a wafer storage apparatus, including providing a rear cover portion; forming through holes in the rear cover portion and inserting gas connecting pipes into the through holes and connecting the gas connecting pipes to a gas supply pipe; disposing a gas supply block on an inner side of the rear cover portion and connecting the gas supply block to the gas supply pipe via the gas connecting pipes; providing a wafer stacking portion having a holder, an upper cover, a bottom plate, and a cover support base; attaching the rear cover portion to a rear surface of the wafer stacking portion wherein the rear cover portion covers the holder; providing an external upper cover to cover an upper portion of the wafer stacking portion; providing an external lateral side cover to cover the rear cover portion, the gas supply pipe and the holder; providing a horizontal support frame and a vertical support frame that support the external upper cover and the external lateral side cover; providing a gas discharging pipe outside the vertical support frame; and connecting an external gas discharging pipe to the gas discharging pipe.

DETAILED DESCRIPTION OF EXEMPLARY EMBODIMENTS

Figure 1:
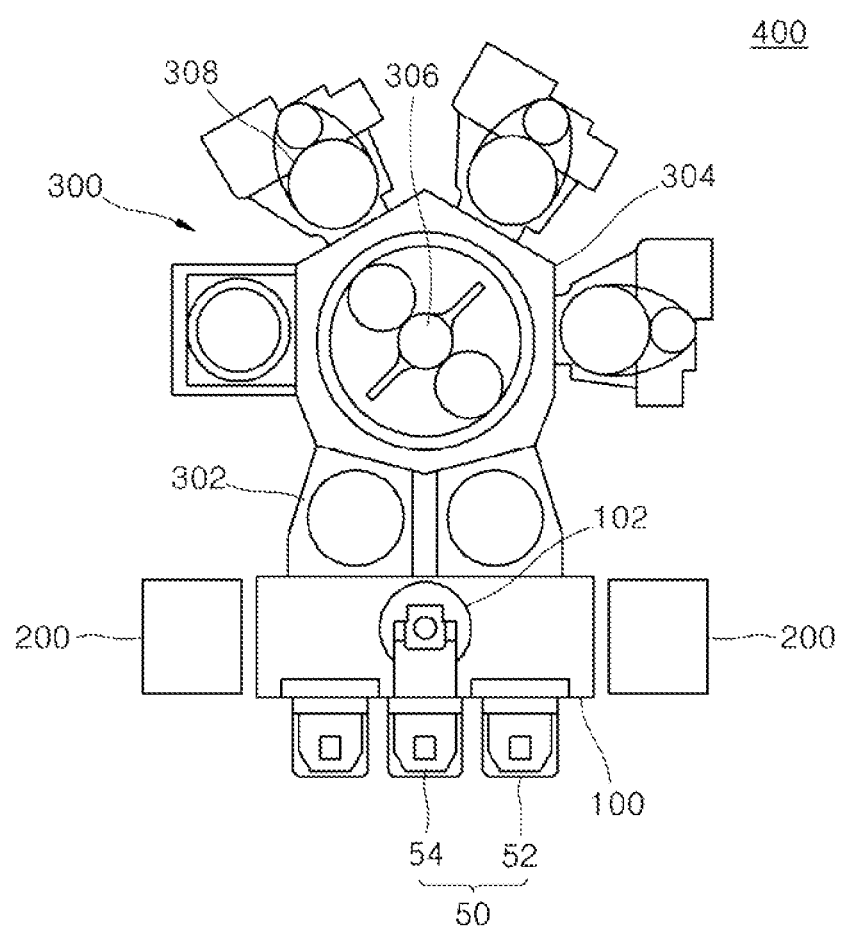
FIG. 1 is a plan view of a semiconductor manufacturing apparatus that includes a wafer storage apparatus according to an embodiment of the inventive concept.

Embodiments of the inventive concept will now be described more fully with reference to the accompanying drawings, in which exemplary embodiments of the inventive concept are shown. The invention may, however, be embodied in many different forms, and should not be construed as being limited to the embodiments set forth herein. In the drawings, the thicknesses of layers and regions may be exaggerated for clarity. Like reference numerals may denote like elements throughout the specification. Throughout the specification, it will also be understood that when an element such as layer, region, or substrate is referred to as being "on" another element, it can be directly on the other element, or intervening elements are not present.

FIG. 1 is a plan view of a semiconductor manufacturing apparatus that includes a wafer storage apparatus according to an embodiment of the inventive concept.

According to an embodiment of the inventive concept, an etching apparatus may be used as an example of a semiconductor manufacturing apparatus 400 of the inventive concept. The semiconductor manufacturing apparatus 400 may be a cluster system capable of processing a plurality of wafers or substrates. The cluster system may refer to a multi-chamber type substrate processing system that includes a transfer robot or handler and a plurality of substrate processing modules that are provided around the transfer robot.

The semiconductor manufacturing apparatus 400 may include a load port portion 50, an equipment front end module 100, a wafer storage apparatus 200, and manufacturing process equipment 300.

The load port portion 50 may include a wafer container 54 and a wafer container support base 52 on which the wafer container 54 is placed, at a front end of the equipment front end module 100. The equipment front end module 100 may be provided with an atmospheric pressure transfer robot 102 that operates at atmospheric pressure. The atmospheric pressure transfer robot 102 transfers a wafer between a front opening unified pod (FOUP) type wafer container or carrier 54 and a load lock chamber 302 of the manufacturing process equipment 300.

The wafer container 54 can accommodate semiconductor substrates such as wafers. An enclosed FOUP may be used as the wafer container 54 to protect the wafers from foreign substances in the air and chemical contamination while being transferred.

The load port portion 50, which includes the wafer container support base 52 with the wafer container 54 placed therein, may be provided at the front end of the equipment front end module 100.

The wafer storage apparatus 200 is positioned on one or both sides of the equipment front end module 100, and may be separately provided. The wafer storage apparatus 200 may be disposed to be partially inserted into the equipment front end module 100. The wafer storage apparatus 200 may transfer wafers that have been subjected to a manufacturing process from manufacturing process equipment 300 and may stack the wafers using the atmospheric pressure transfer robot 102. The wafer storage apparatus 200 may be filled with gas, such as nitrogen or an inert gas, and may remove moisture or residual gases which have foamed on the surface of the wafer. The wafer storage apparatus 200 will be described in more detail below.

The manufacturing process equipment 300 may include a load lock chamber 302, a transfer chamber 304, and a plurality of process chambers 308. The transfer chamber 304 is capable of transferring a wafer or substrate, such as a wafer having a diameter of 300 mm, and the plurality of process chambers 308 can perform a dry etch process on the wafer. The transfer chamber 304 may be provided with a transfer robot 306 that freely rotates. The process chambers 308 and two load lock chambers 302 may be connected to each side of the transfer chamber 304.

According to an embodiment of the inventive concept, a representative example of a substrate to be processed in the semiconductor manufacturing apparatus 400 may be a wafer for manufacturing a semiconductor circuit. In addition to the components of the semiconductor manufacturing apparatus 400 which are illustrated in FIG. 1, other processing systems may be used to perform the processes needed to completely manufacture an integrated circuit or a chip. However, ordinary components such as those that may be understood by one of ordinary skill in the art are omitted for a more clear explanation of the inventive concept.

The load lock chamber 302 may form the same vacuum atmosphere as the transfer chamber 304 when the transfer robot 306 of the transfer chamber 308 loads or unloads a wafer, and may be supplied with an unprocessed wafer from the equipment front end module 100. When a processed wafer is transferred to the equipment front end module 100, the load lock chamber 302 is maintained at atmospheric pressure.

The load lock chamber 302 maintains pressure while alternating between a vacuum state and an atmospheric pressure state to prevent a change in a pressure state of the transfer chamber 304. The inside of the load lock chamber 302 may be provided with a buffer stage on which a wafer may be temporarily disposed.

The substrate processed in the process chamber 308 may be transferred into the load lock chamber 302 in a vacuum state by the transfer robot 306 of the transfer chamber 304. The wafer may be loaded and stored in the wafer storage apparatus 200 to remove moisture or gas remaining on the wafer after an etching process in the process chamber 308. As described above, the wafer storage apparatus 200 may be filled with gas and may remove moisture or residual gas that has formed on the surface of the wafer.

The just-processed wafer may be temporarily disposed within the wafer storage apparatus 200 before being placed in the wafer container 54. The wafer storage apparatus 200 in which a wafer is temporarily disposed may be checked for humidity and a residual gas. When humidity is high or the amount of residual gas exceeds a predetermined permissible level, gas may fill the wafer storage apparatus 200 to decrease humidity and reduce the amount of the residual gas.

When a residual gas or the humidity is less than a permissible level, the wafer may be removed from the wafer storage apparatus 200 using the atmospheric pressure transfer robot 102 of the equipment front end module 100 and may be placed in the wafer container 54. In this way, contamination of the wafer may be prevented by adjusting a humidity or an amount of residual gas in the wafer storage apparatus 200.

Figure 2:
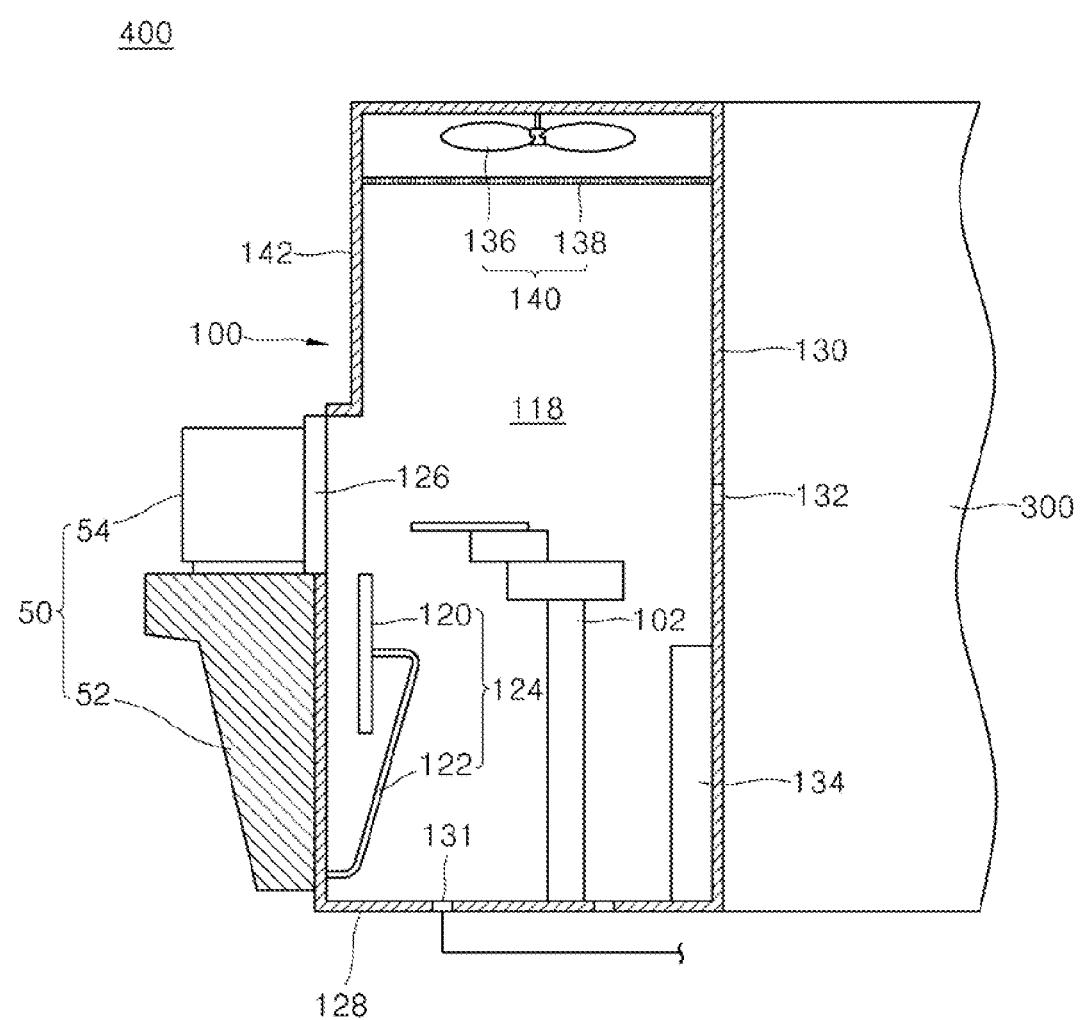
FIG. 2 is a cross-sectional view of a semiconductor manufacturing apparatus according to an embodiment of the inventive concept.

FIG. 2 is a cross-sectional view of a semiconductor manufacturing apparatus according to an embodiment of the inventive concept.

Specifically, as described above, the semiconductor manufacturing apparatus 400 according to an embodiment of the inventive concept may include the load port portion 50, the equipment front end module 100, and the manufacturing process equipment 300. As described above, the load port portion 50 may include the wafer container 54 and the wafer container support base 52 in which the wafer container 54 is placed, at the front end of the equipment front end module 100.

The equipment front end module 100 may be used to transfer a wafer between the wafer container 54 and the manufacturing process equipment 300. The equipment front end module 100 may include a housing 128 having an enclosed space 118 therein, a cleaning unit 140, and a transfer robot 102. The manufacturing process equipment 300 may be chemical vapor deposition equipment, a thermal furnace, developing equipment, or cleaning equipment, in addition to the dry etch equipment described above. The housing 128 may have a rectangular parallelepiped shape. A rear wall 130 of the housing 128, which is adjacent to the manufacturing process equipment 300, may be provided with an inlet passage 132 for transferring a wafer, and a front surface 142 of the housing 128 is provided with an opening adjacent to the wafer container 54.

The cleaning unit 140 is disposed in an upper portion of the enclosed space 118 within the housing 128 to maintain the enclosed space 118 at a predetermined cleanliness level. The cleaning unit 140 may include a fan 136 and a filter 138 which are disposed on the upper side of the housing 128. The fan 136 allows air to flow from the upper side to the lower side within the enclosed space 118, and the filter 138 removes particles in the air to filter the air. A bottom surface of the housing 128 may be provided with an exhaust outlet passage 131. Air in the enclosed space 118 may be naturally expelled or may be forcibly expelled through the outlet passage 131 using a pump. The transfer robot 102 may transfer a wafer between the load port portion 50 and the manufacturing process equipment 300, and may be controlled by a controller 134. A plurality of transfer robots 102 may be disposed within the housing 128.

A door 126 of the wafer container 54 may be positioned at the opening of the front surface 142 of the housing 128. A door opener 124 for opening the door 126 of the wafer container 54 may be provided within the housing 128. The door opener 124 may include a door holder 120, an arm 122, and a driving unit. The door holder 120 may have a size and a shape which correspond to those of the door 126. The arm 122 may be fixed and coupled to the rear surface of the door holder 120, and may be driven by a driving unit.

Figure 3:
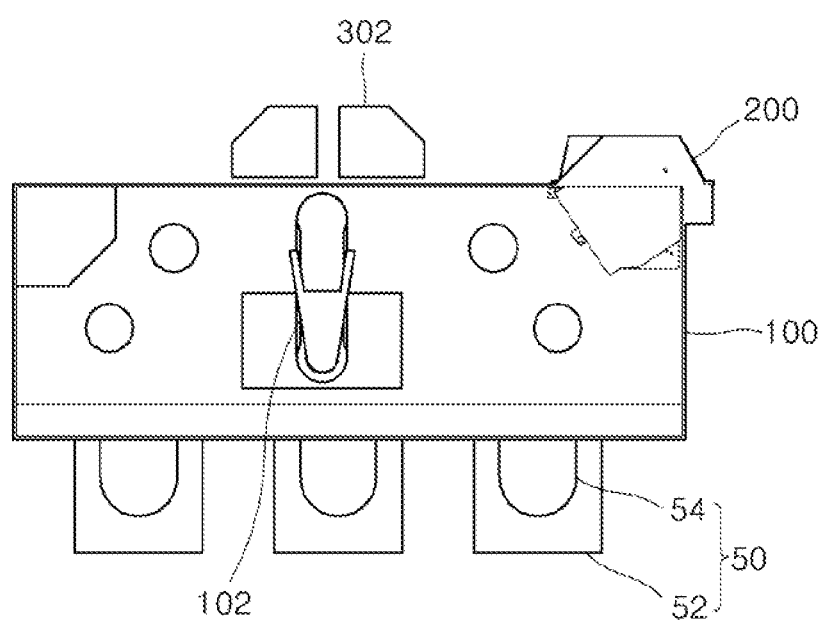
FIG. 3 is a plan view of a load port portion, an equipment front end module, and a wafer storage apparatus of a semiconductor manufacturing apparatus according to an embodiment of the inventive concept.
Figure 4:
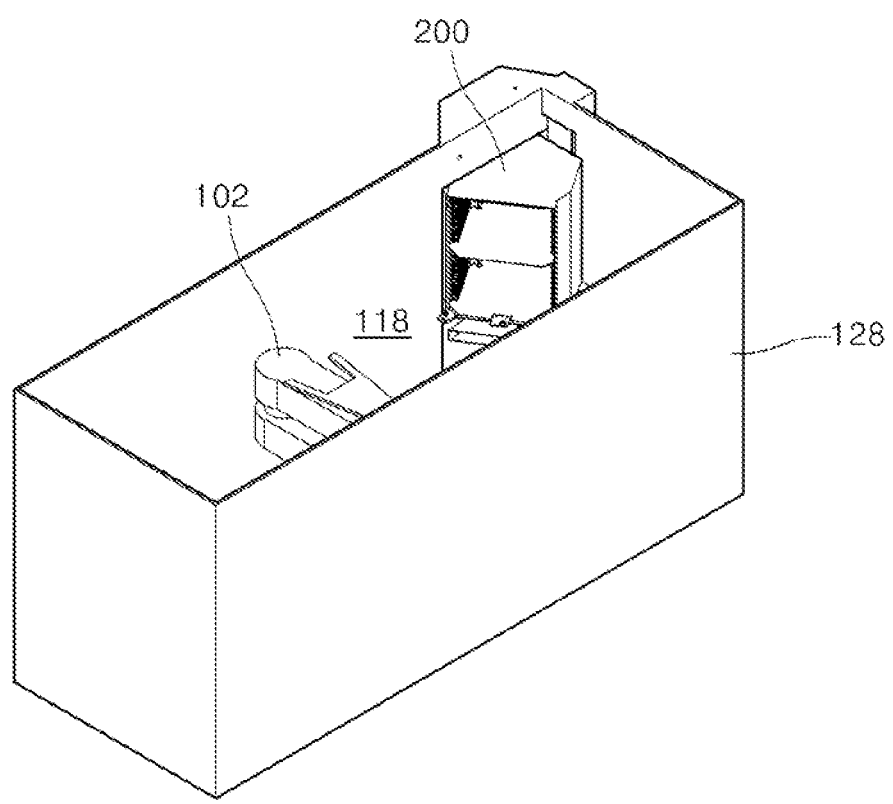
FIG. 4 is a perspective view of the equipment front end module and the wafer storage apparatus of FIG. 3.

FIG. 3 is a plan view of a load port portion, an equipment front end module, and a wafer storage apparatus of a semiconductor manufacturing apparatus according to an embodiment of the inventive concept. FIG. 4 is a perspective view of the equipment front end module and the wafer storage apparatus of FIG. 3.

Specifically, the load port portion 50 that includes the wafer container 54 and the wafer container support base 52 is positioned at the front end of the equipment front end module 100. The load lock chamber 302 of the manufacturing process equipment is positioned at a rear end of the equipment front end module 100.

The wafer storage apparatus 200 is positioned at one end of the equipment front end module 100. The wafer storage apparatus 200 may be partially inserted into the enclosed space 118 of the housing 128 of the equipment front end module 100. The just-processed wafers may be transferred from the load lock chamber 302 of the manufacturing process equipment using the atmospheric pressure transfer robot 102 and may be stacked in the wafer storage apparatus 200, and the wafer storage apparatus 200 may be filled with gas, such as nitrogen or an inert gas, to remove moisture or any residual gases which have formed on the surface of the wafer.

Figure 5:
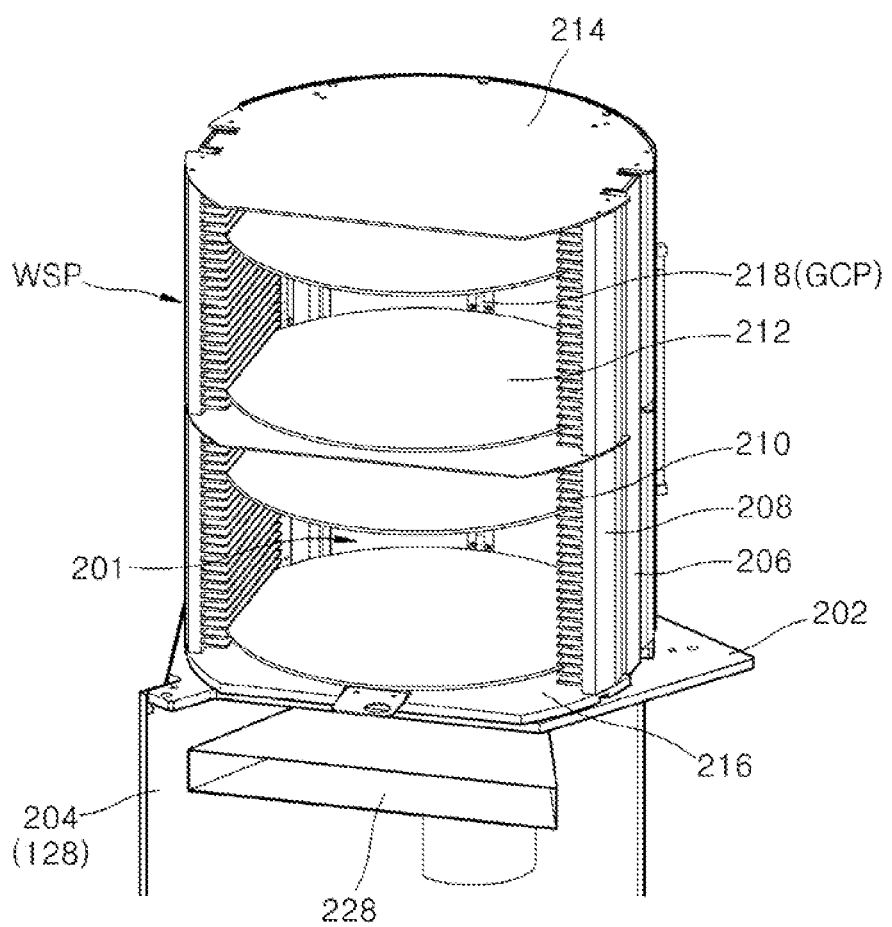
FIG. 5 is a front perspective view of a wafer storage apparatus according to an embodiment of the inventive concept.
Figure 6:
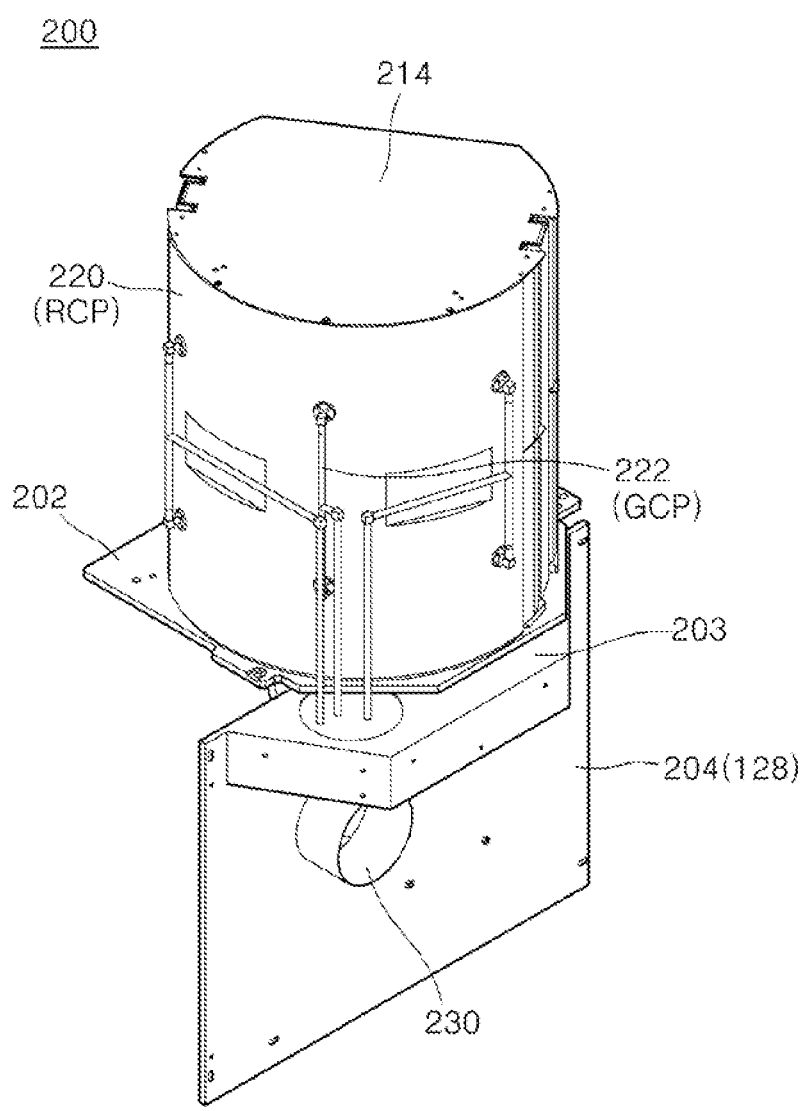
FIG. 6 is a rear perspective view of a wafer storage apparatus according to an embodiment of the inventive concept.

FIG. 5 is a front perspective view of a wafer storage apparatus according to an embodiment of the inventive concept. FIG. 6 is a rear perspective view of a wafer storage apparatus according to an embodiment of the inventive concept.

Specifically, the wafer storage apparatus 200 according to an embodiment of the inventive concept may be provided with a wafer stacking portion WSP on horizontal support frames 202 and 203 in which wafers 212 may be stacked. The horizontal support frames 202 and 203 may be supported by a vertical support frame 204. The housing 128 of the equipment front end module 100 described above may be used as the vertical support frame 204. The wafer stacking portion WSP may have an internal space 201 having an open front side so that the plurality of wafers 212 may be placed therein. The wafers 212 may be stacked in the internal space 201.

The wafer stacking portion WSP may include a holder 208 that holds and supports the wafers 212. The holder 208 may be provided with a plurality of slits 210 parallel to each other so that ends of the wafers 212 may be inserted into the holder 208. The wafers 212 may be arranged in parallel and separated from each other by the slits. The holder 208 may be disposed on both sides of the internal space 201.

The wafer stacking portion WSP may include an upper cover 214 and a bottom plate 216. The upper cover 214 and the bottom plate 216 may be provided on upper and lower portions of the holder 208, respectively. The wafer stacking portion WSP may be provided with a cover support base 206 that supports the upper cover 214 on the bottom plate 216.

In the wafer storage apparatus 200, a rear cover portion RCP 220 capable of preventing air from flowing into the space 201 may be provided on the back side of the wafer stacking portion WSP. The rear cover portion RCP 220 may be provided to cover the holder 208 and shield it from the outside. Air may be prevented from flowing into the internal space 201 of the wafer stacking portion WSP by the holder 208 and the rear cover portion RCP 220. A humidity sensor 248, shown in FIG. 16, may be provided within the wafer stacking portion WSP. When the humidity sensor is used, humidity within the wafer stacking portion WSP may be adjusted to a predetermined value, such as less than or equal to about 30% to volatilize gas or moisture within the wafer stacking portion WSP.

The wafer storage apparatus 200 may include a gas charging portion GCP capable of injecting gas into the wafer stacking portion WSP from the back side on which the rear cover portion RCP 220 is provided.

The gas charging portion GCP may include gas supply blocks 218 provided on the inner side of the rear cover portion RCP.

The gas supply blocks 218 may be provided near the center on the inner side of the rear cover portion RCP 220, that is, on the left side and the right side of the center, respectively. The gas charging portion GCP may include a plurality of gas supply pipes 222 connected to the gas supply blocks 218. The gas supply blocks 218 may be bars on the inner front surface of the rear cover portion RCP 220 that extend from the bottom plate 216 of the wafer stacking portion WSP toward the upper cover 214.

The wafer storage apparatus 200 may be provided with a gas inflow pipe 228 on the inner side of the vertical support frame 204 (128) that supports the wafer stacking portion WSP from below. The gas inflow pipe 228 may be provided inside the housing 128 of the equipment front end module. A gas discharging pipe 230 may be provided outside the vertical support frame 204 (128).

Figure 7:
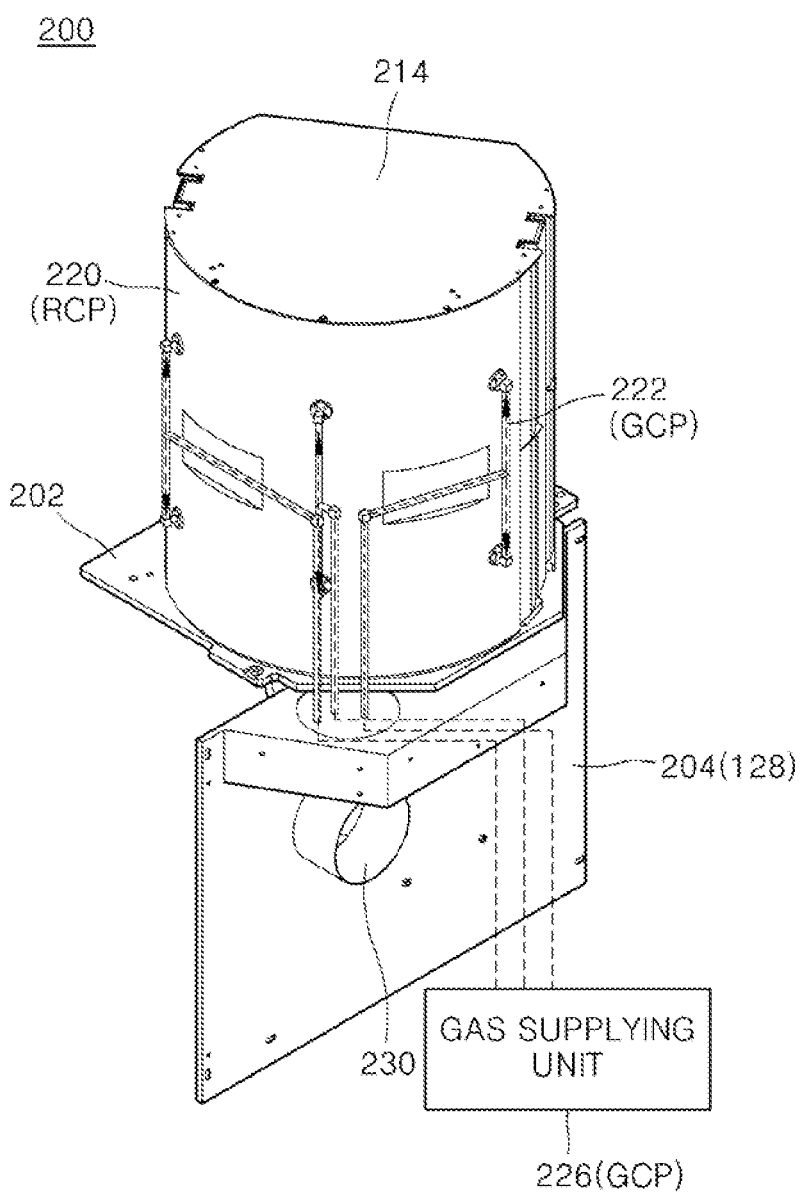
FIG. 7 is a rear perspective view of a flow of gas in a wafer storage apparatus according to an embodiment of the inventive concept.
Figure 8:
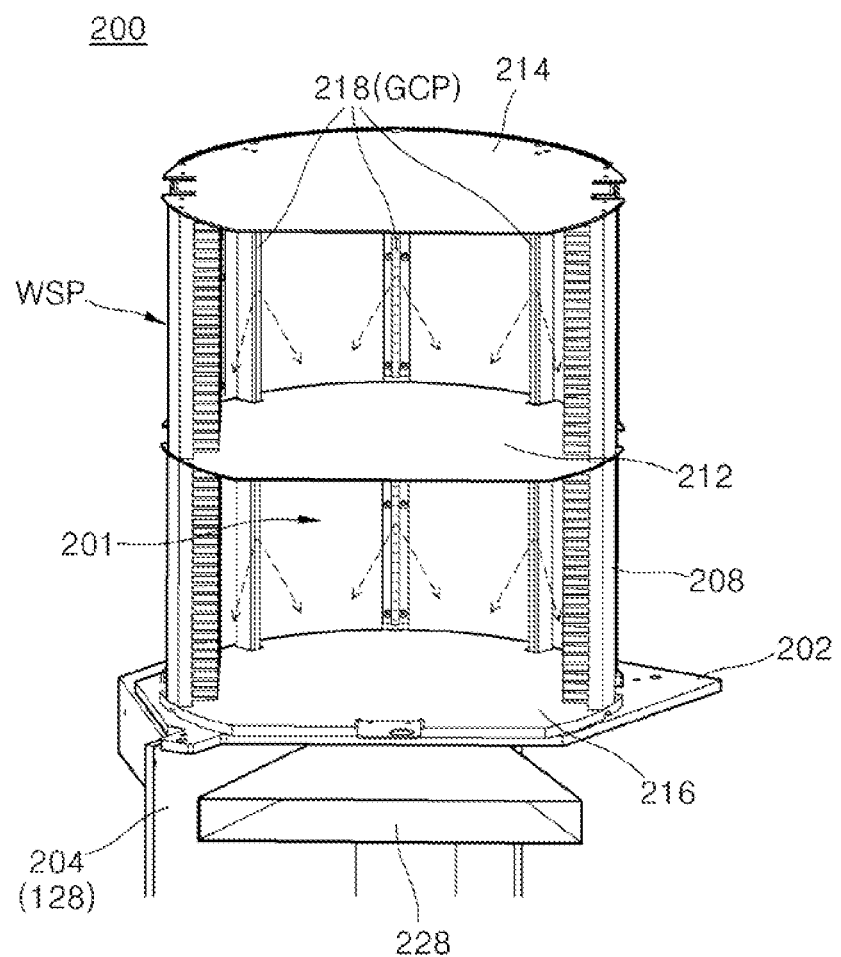
FIG. 8 is a front perspective view of a flow of gas in a wafer storage apparatus according to an embodiment of the inventive concept.
Figure 9:
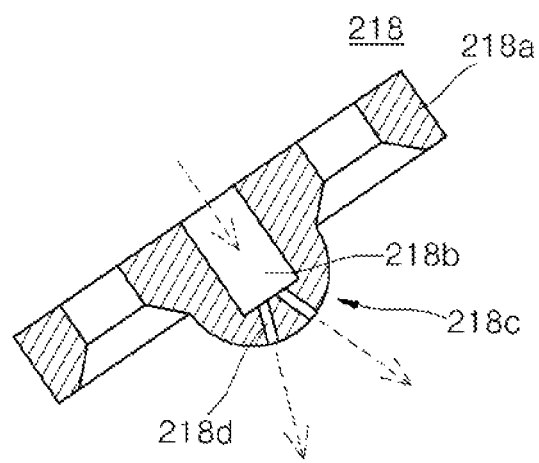
FIG. 9 is an enlarged view of a portion of a gas supplying block of a gas charging portion of FIG. 8.

FIG. 7 is a rear perspective view of a flow of gas in a wafer storage apparatus according to an embodiment of the inventive concept. FIG. 8 is a front perspective view of a flow of gas in a wafer storage apparatus according to an embodiment of the inventive concept. FIG. 9 is an enlarged view of a portion of a gas supply block of a gas charging portion of FIG. 8.

Figure 11:
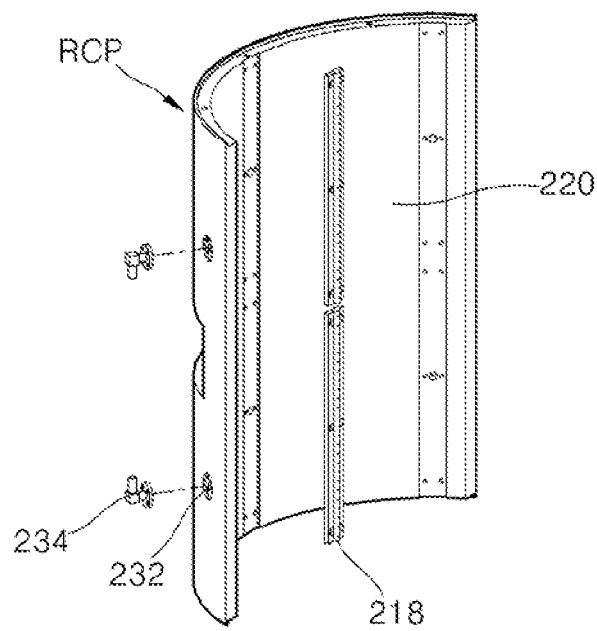
FIGS. 11 to 15 are perspective views of a process of assembling a wafer storage apparatus according to an embodiment of the inventive concept.

Specifically, the gas charging portion GCP of the wafer storage apparatus 200 includes the plurality of gas supply blocks 218 on the inner side of the rear cover portion RCP 220, the plurality of gas supply pipes 222 connected to the gas supply blocks 218 via through holes 232, shown in FIG. 11, which are disposed in the rear cover portion RCP 220, and a gas supply unit 226 connected to the gas supply pipes 222. As described above, the gas supplying blocks 218 may be bars on the inner front surface of the rear cover portion RCP 220 that extends from the bottom plate 216 of the wafer stacking portion WSP toward the upper cover 214.

Gas supplied from the gas supply unit 226, such as nitrogen or an inert gas, flows to the gas supply blocks 218 through the gas supply pipes 222 as shown by dotted lines of FIG. 7. The gas flowing to the gas supply blocks 218 may be injected into the internal space 201 from the rear side as shown by arrow lines of FIG. 8 and may fill the internal space 201 of the wafer stacking portion WSP. The internal space 201 of the wafer stacking portion WSP may be filled with gas while the rear cover portion RCP and the holder 208 prevent external air from flowing thereinto.

As illustrated in FIG. 9, the gas supply block 218 may include a body portion 218a, a gas flow line 218b formed in the body portion 218a, and a plurality of gas spraying units 218c connected to the gas flow line 218b. Each of the gas spraying units 218c may be provided with a plurality of spraying holes 218d to spray gas in a plurality of directions. For convenience of description, FIG. 9 illustrates only one gas spraying unit 218c.

As shown by arrows of FIG. 9, gas flowing into the gas flow line 218b is sprayed by the plurality of gas spraying units 218c, and each of the gas spraying units 218c is provided with the plurality of spraying holes 218d through which the gas is sprayed in a plurality of directions.

Figure 10:
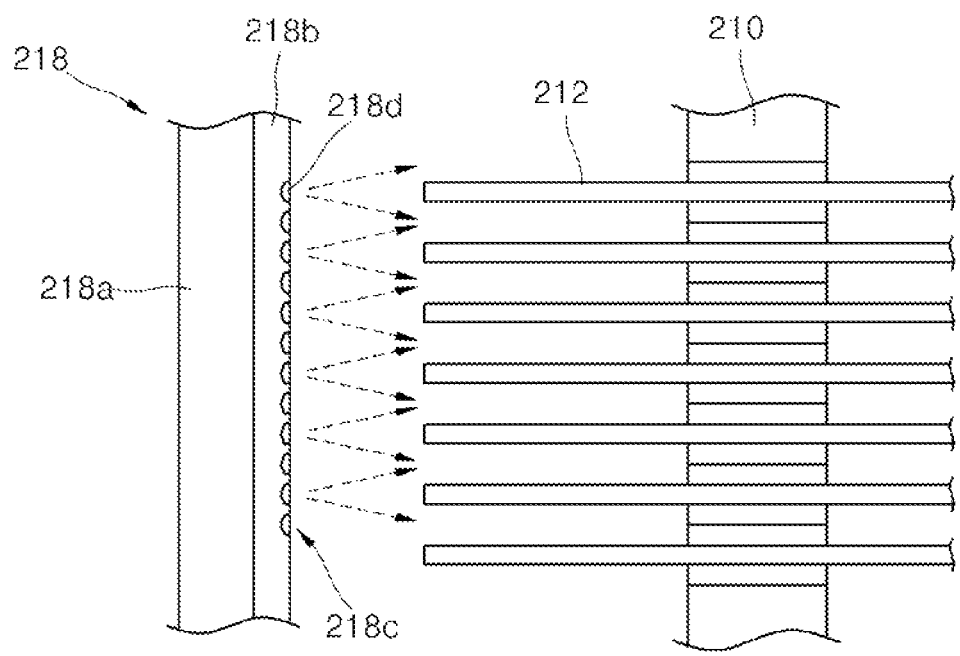
FIG. 10 is a cross-sectional view of a flow of gas into a wafer from a gas spray filling unit of a wafer storage apparatus according to an embodiment of the inventive concept.

FIG. 10 is a cross-sectional view of a flow of gas into a wafer from a gas spray filling unit of a wafer storage apparatus according to an embodiment of the inventive concept.

Specifically, in a wafer storage apparatus according to an embodiment of the inventive concept, gas is injected onto a wafer from the gas supply block 218. As described above with reference to FIG. 9, the gas charging portion may include the body portion 218a, the gas flow line 218b, the gas spraying units 218c, and the spraying holes 218d. In FIG. 10, reference numeral 210 may denote a slot. As described above with reference to FIG. 9, gas is injected from the gas spraying units 218c through the plurality of spraying holes 218d to be sprayed in a plurality of directions.

The gas may be injected into spaces between the wafers 212 and onto the surfaces of the wafers 212 and may be filled therein. In addition, the injected gas may also fill the internal space 201 of the wafer stacking portion WSP. The filled gas may be discharged through the gas discharging pipe 230 to reduce contamination of the wafers 212 due to gas and moisture which are present on the surfaces of the wafers 212, in the spaces between the wafers 212, and in the internal space 201 of the wafer stacking portion WSP.

FIGS. 11 to 15 are perspective views of a process of assembling a wafer storage apparatus according to an embodiment of the inventive concept.

Specifically, as illustrated in FIG. 11, the rear cover portion RCP 220 and the gas supply block 218 are prepared. The rear cover portion RCP 220 may be provided with the through holes 232 through which the gas supply pipe 222 may pass. A gas connecting pipe 234 that can connect to the gas supply pipe 222 may be inserted into the through hole 232.

The gas supply block 218 can connect to the gas supply pipe 222 via the gas connecting pipe 234 through the through hole 232 and may be disposed on the inner side of the rear cover portion RCP 220. FIG. 11 illustrates one gas supply block 218 for convenience of description.

Figure 12:
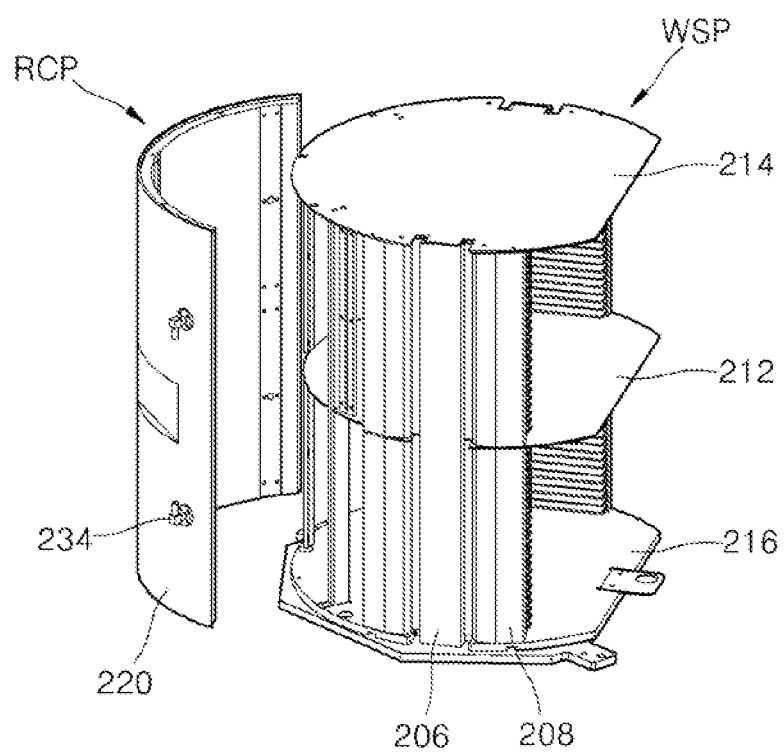

As illustrated in FIG. 12, the wafer stacking portion WSP is prepared. The wafer stacking portion WSP may accommodate the wafers 212 stacked therein, and may be provided with the holder 208, the upper cover 214, the bottom plate 216, and the cover support base 206, etc. The rear cover portion RCP 220 may be attached to the rear surface of the wafer stacking portion WSP. The rear cover portion RCP 220 may cover the holder 208 to shield it from the outside. Thus, air may be prevented from flowing into the wafer stacking portion WSP.

Figure 13:
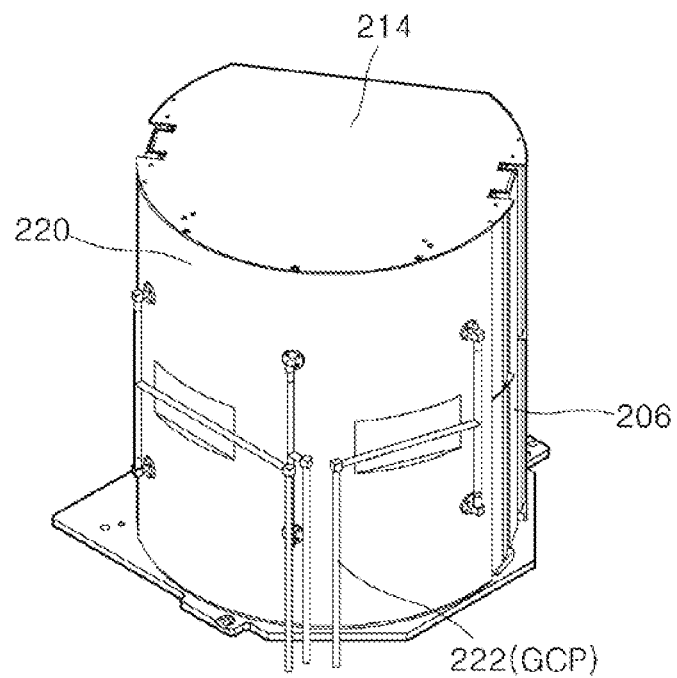

As illustrated in FIG. 13, the gas supply pipe 222 is connected to the gas connecting pipe 234 to provide the gas charging portion GCP, including the gas supply block 218 and the gas supply pipes 222. The gas supply unit 226 may be connected to the gas supply pipes 222 later.

Figure 14:
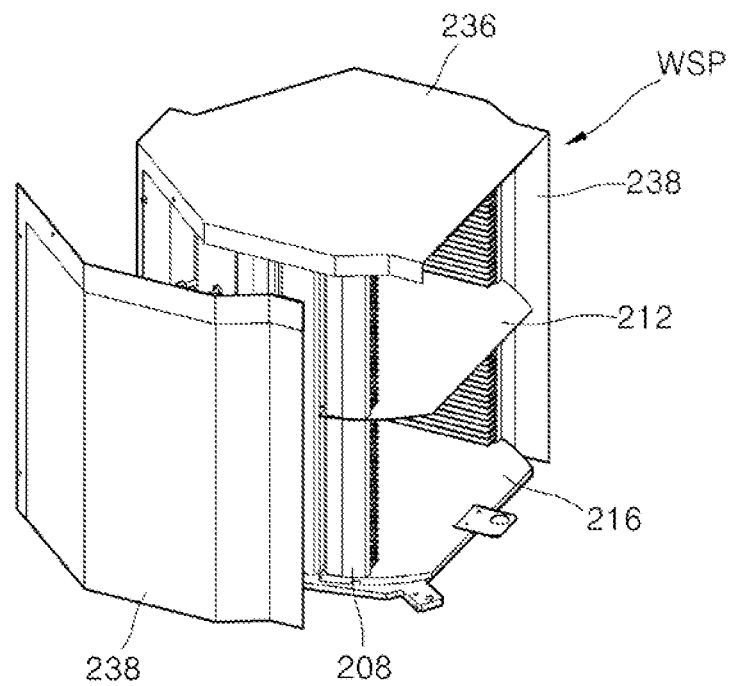

As illustrated in FIG. 14, an external upper cover 236 is provided that covers an upper portion of the wafer stacking portion WSP. An external lateral side cover 238 is provided that covers the rear cover portion RCP 220, the gas supply pipes 222 and the holder 208. In this way, the external upper cover 236 and the external lateral side cover 238 may protect the wafer stacking portion WSP, the rear cover portion RCP, and the gas charging portion GCP.

Figure 15:
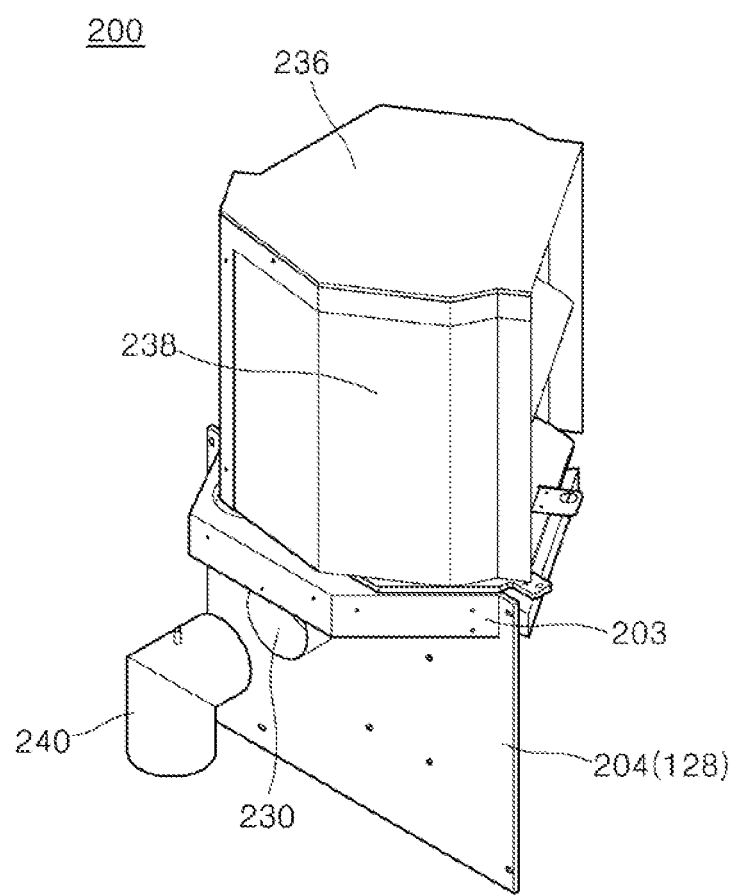

As illustrated in FIG. 15, the external upper cover 236 and the external lateral side cover 238 is supported by the horizontal support frame 203 and the vertical support frame 204. The housing 128 of the above-described equipment front end module may be used as the vertical support frame 204. Subsequently, the gas discharging pipe 230 may be provided outside the vertical support frame 204 (128), and an external gas discharging pipe 240 may be connected to the gas discharging pipe 230. The assembly of the wafer storage apparatus 200 may be completed through such a process.

Figure 16:
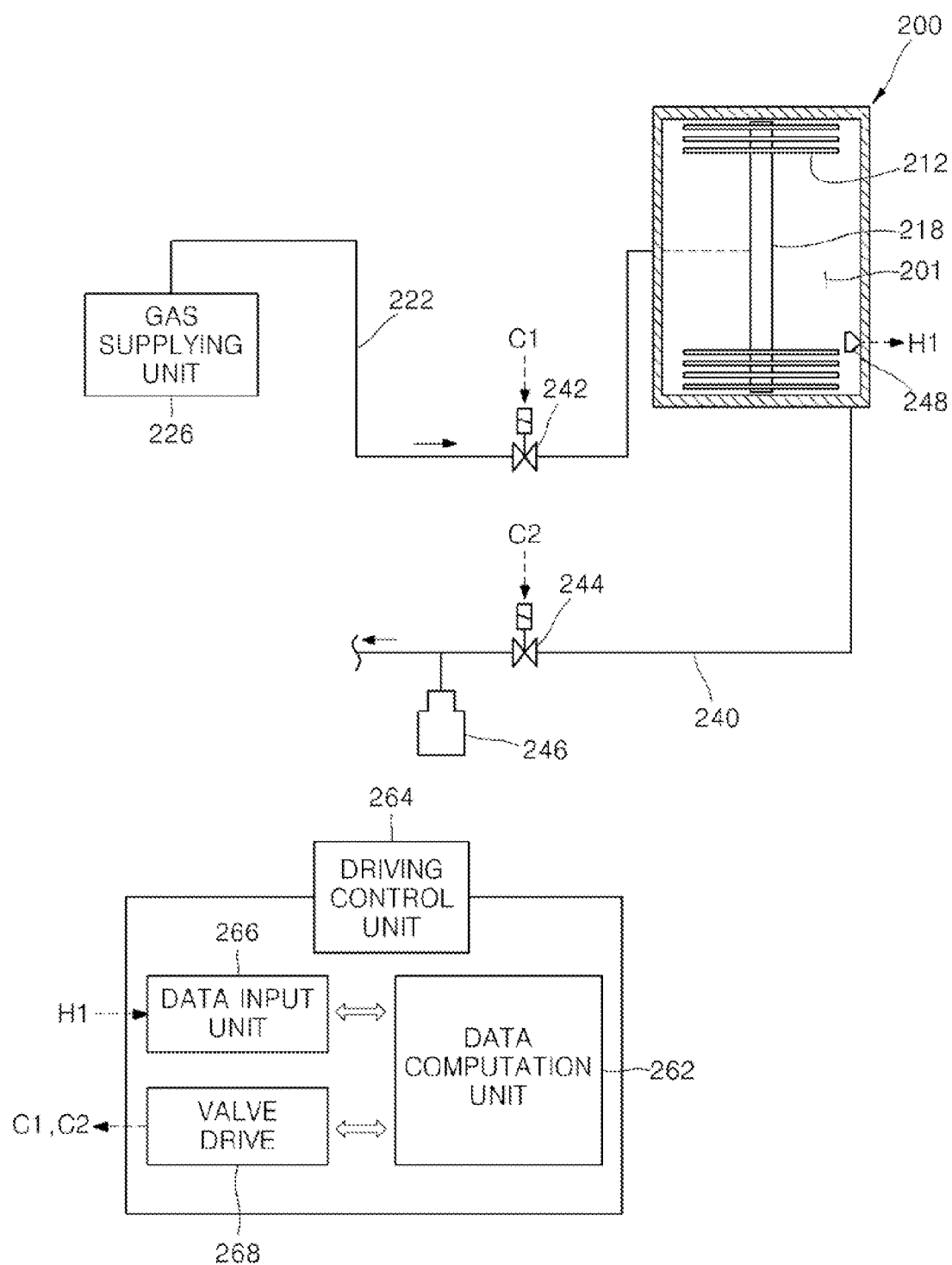
FIG. 16 is a schematic block diagram of a configuration of a wafer storage apparatus according to an embodiment of the inventive concept.

FIG. 16 is a schematic block diagram of a configuration of a wafer storage apparatus according to an embodiment of the inventive concept.

Specifically, FIG. 16 is a detailed view of the main portions to conceptually clarify a configuration relationship of a wafer storage apparatus according to an embodiment of the inventive concept.

As described above, the wafer storage apparatus 200 includes the wafer stacking portion WSP in which the wafers 212 are stacked. The wafers 212 may be vertically stacked and separated from each other within the wafer stacking portion WSP. The gas supply block 218 of the gas charging portion GSP may be provided on the back side of the wafer stacking portion WSP. Gas supplied from the gas supply unit 226, such as nitrogen or an inert gas may be supplied through the gas supply pipes 222 and the gas supply block 218 to fill the internal space 201 of the wafer stacking portion WSP.

The gas supply unit 226 may be a storage tank that stores gas, and may be filled with gas at a pressure equal to or greater than a predetermined pressure. Various filters may be provided between the gas supply unit 226 and the gas supply pipes 222 to remove foreign substances from the gas flowing toward the wafer stacking portion WSP. An alloy such as stainless steel (SUS) may be used as a material of the gas supply pipes 222. Alternatively, a freely deformable flexible material, such as a synthetic resin, may be used as the material of the gas supply pipes 222. The position, arrangement, and shape of the gas supply pipes 222 may vary according to embodiments, and thus the gas supply pipes 222 are not limited to the configurations illustrated in FIG. 16.

The wafer storage apparatus 200 may include a driving control unit 264 that may control gas flow in the gas supply pipes 222 or the external gas discharging pipe 240. The gas supply pipes 222 may be provided with a gas supply valve 242. The gas supply valve 242 receives a corresponding first control signal C1 from the driving control unit 264 and adjusts the opening and closing of a gas flow. According to an embodiment of the inventive concept, the gas supply valve 242 may be a solenoid that is controlled by an electrical signal from the driving control unit 264.

Moisture or a residual gas present in the internal space 201 of the wafer stacking portion WSP may be discharged through the external gas discharging pipe 240. In addition to moisture or residual gases within the wafer stacking portion WSP, gas injected through the gas supply pipes 222 may also be discharged through the external gas discharging pipe 240.

The external gas discharging pipe 240 may be provided with a gas discharging valve 244. The position, arrangement, and shape of the external gas discharging pipe 240 may vary according to embodiments, and thus the external gas discharging pipe 240 is not limited to the configuration illustrated in FIG. 16. Similar to the gas supply pipes 222, an alloy such as stainless steel (SUS) or a freely deformable flexible material such as a synthetic resin may be used as the material of the external gas discharging pipe 240.

The gas discharging valve 244 is opened and closed in the same way as the gas supply valve 242 described above to discharge gas, air, moisture, etc., within the wafer stacking portion WSP or to block the discharge thereof. The gas discharging valve 244 may be opened and closed by a second control signal C2 from the driving control unit 264. Thus, the gas supply valve 242 and the gas discharging valve 244 may be individually or simultaneously opened and closed.

The external gas discharging pipe 240 may further be provided with an ejector 246 that provides a force to discharge gas or moisture from within the wafer stacking portion WSP. The ejector 246 may form a negative pressure to discharge gas or moisture from within the wafer stacking portion WSP. The ejector 246 can decrease the internal pressure of the wafer stacking portion WSP through the external gas discharging pipe 240, and thus gas or moisture within the wafer stacking portion WSP may be expelled.

The humidity sensor 248 may be provided within the wafer stacking portion WSP to measure and detect inner humidity. The humidity sensor 248 senses whether the inner humidity of the wafer stacking portion WSP is maintained at a predetermined value. In other words, the humidity sensor 248 may be used to maintain an inner humidity within the wafer stacking portion WSP at a reference humidity value. A humidity value H1 within the wafer stacking portion WSP is detected by the humidity sensor 248 in real time or at set time intervals, and thus the injection of gas may be controlled by the driving control unit 264.

When the humidity sensor 248 is used, the humidity within the wafer stacking portion WSP may be adjusted to the reference value, such as less than or equal to about 30%, and thus gas or moisture within the wafer stacking portion WSP may be volatilized.

The driving control unit 264 controls the discharge of residual gases or moisture from the wafers 212 accommodated in the wafer stacking portion WSP according to a set driving logic. The driving control unit 264 may compare the real-time humidity value H1 detected by the humidity sensor 248 with a reference humidity value, transmit first control signal C1 to gas supply valve 242 to control the opening and closing of gas flow supplied to the wafer stacking portion WSP, and transmit second control signal C2 to gas discharging valve 244 to control the opening and closing of exhaust gas being expelled from the wafer stacking portion WSP.

The driving control unit 264 may include a data input unit 266, a data computation unit 262, and a valve drive 268. The data input unit 266 can receive a programmed driving logic, such as a programmed logic control, or receives the humidity value H1 detected by the humidity sensor 248.

Data received through the data input unit 266 is transmitted to the data computation unit 262. The data computation unit 262 controls the valve drive 268 in response to the input driving logic. In addition, the humidity value H1 detected by the humidity sensor 248 can be compared with a reference humidity value to determine whether an error is present therebetween, and feed-back control may be performed to control the valve drive 268 to remove the error.

In a wafer storage apparatus according to an embodiment of the inventive concept, gas fills a chamber through a gas charging portion, which may reduce contamination of a wafer due to gas and moisture.

A semiconductor manufacturing apparatus according to an embodiment of the inventive concept can include a wafer storage apparatus, including the gas charging portion, and thus a semiconductor device may be manufactured while reducing the contamination of the wafer.

While embodiments of the inventive concept has been particularly shown and described with reference to exemplary embodiments thereof, it will be understood that various changes in form and details may be made therein without departing from the spirit and scope of the following claims.

What is claimed is:
1. A wafer storage apparatus comprising:
   a wafer stacking portion enclosing an internal space with an open front side to receive a plurality of wafers;
   a rear cover portion disposed on a back side of the wafer stacking portion;
   a gas charging portion that includes a plurality of gas supply blocks disposed on an inner side of the rear cover portion, a plurality of gas supply pipes disposed on an outer side of the rear cover portion and that are connected to the gas supply blocks via through holes in the rear cover portion, and a gas supply unit connected to the as supply pipes,
   a load port portion comprising a wafer container in which a plurality of wafers are stacked;
   an equipment front end module comprising a transfer robot that transfers wafers within the water container to a manufacturing process equipment or transfer wafers to the wafer container from the manufacturing process equipment; and
   a load lock chamber in a front end portion thereof that transfers just-manufactured wafers to the wafer storage apparatus,
   wherein the wafer storage apparatus is positioned on one side of the equipment front end module and transfers just-manufactured wafers from the manufacturing process equipment and stacks the wafers using the transfer robot.

2. The wafer storage apparatus of claim 1, wherein the wafer stacking portion comprises holders disposed on both sides of the internal space,
   each holder including a plurality of parallel slits that receive ends of wafers being inserted therein to, separate wafers from each other and stack the wafers parallel to each other.

3. The wafer storage apparatus of claim 2, wherein the wafer stacking portion comprises an upper cover and a bottom plate in upper and lower portions of the holders, respectively, and
   wherein the gas supplying blocks are bars on an inner front surface of the rear cover portion that extend from a bottom plate of the wafer stacking portion toward the upper cover.

4. The wafer storage apparatus of claim 3, wherein the wafer stacking portion comprises a cover support base that supports the upper cover on the bottom plate.

5. The wafer storage apparatus of claim 2, wherein the rear cover portion shields the holder from the outside and prevents air from flowing into the internal space.

6. The wafer storage apparatus of claim 1, further comprising
   a vertical support frame disposed on the lower side of the wafer stacking portion that supports the wafer stacking portion, and
   a gas inflow pipe and a gas discharging pipe disposed inside and outside the vertical supporting frame, respectively.

7. The wafer storage apparatus of claim 6, further comprising a humidity sensor disposed within the wafer stacking portion.

8. The wafer storage apparatus of claim 7, wherein
   the gas inflow pipe includes a gas supply valve,
   the gas discharging pipe includes a gas discharging valve, and further comprising
   a driving control unit configured to compare a humidity value detected by the humidity sensor with a reference humidity value, transmits a first control signal to the gas supply valve gas to control gas flow into the wafer stacking portion, and transmits a second control signal to the gas discharging valve to control the exhaust gas being expelled from the wafer stacking portion.

9. The wafer storage apparatus of claim 1, wherein the gas supply blocks are disposed on an inner side of the rear cover portion, on a left side of a center of the rear cover portion, and on the right side of the center, respectively.

10. The wafer storage apparatus of claim 9, wherein each of the plurality of gas supply block comprises;
   a body portion,
   a gas flow line within the body portion, and
   a plurality of gas spraying units connected to the gas flow line, wherein each of the gas spraying units includes a plurality of spraying holes to spray gas in a plurality of directions.

11. A wafer storage apparatus comprising:
   a wafer stacking portion enclosing an internal space with an open front side to receive a plurality of wafers and including holders disposed on both sides of the internal space, an upper cover, and a bottom plate in upper and lower portions of the holders;
   a rear cover portion disposed on a back side of the wafer stacking portion;
   a gas charging portion that includes a plurality of gas supply blocks provided on the inner side of the rear cover portion that injects gas into the wafer stacking portion from the back side of the rear cover portion, wherein the gas supply block includes a plurality of gas spraying units, wherein each of the gas spraying units is provided with a plurality of spraying holes to spray gas in a plurality of directions,
   a load port portion comprising a wafer container in which a plurality of wafers are stacked;
   an equipment front end module comprising a transfer robot that transfers wafers within the water container to a manufacturing process equipment or transfer wafers to the wafer container from the manufacturing process equipment; and
   a load lock chamber in a front end portion thereof that transfers just-manufactured wafers to the wafer storage apparatus,
   wherein the wafer storage apparatus is positioned on one side of the equipment front end module and transfers just-manufactured wafers from the manufacturing process equipment and stacks the wafers using the transfer robot.

12. The wafer storage apparatus of claim 11, wherein each holder includes a plurality of parallel slits that receive ends of wafers being inserted therein, to separate wafers from each other and to stack the wafers parallel to each other.

13. The wafer storage apparatus of claim 11, further comprising
   a vertical supporting frame provided on the lower side of the wafer stacking portion to support the wafer stacking portion; and
   a gas inflow pipe and a gas discharging pipe are provided inside and outside the vertical supporting frame, respectively.

14. The wafer storage apparatus of claim 13, wherein
   the gas inflow pipe includes a gas supply valve,
   the gas discharging pipe includes a gas discharging valve, and further comprising
   a humidity sensor disposed within the wafer stacking portion; and
   a driving control unit configured to compare a humidity value detected by the humidity sensor with a reference humidity value, transmit a first control signal to the gas supply valve gas to control gas flow into the wafer stacking portion, and transmit a second control signal to the gas discharging valve to control exhaust gas being expelled from the wafer stacking portion.

15. The wafer storage apparatus of claim 11, wherein the gas charging portion further comprises:
   a plurality of gas supply pipes disposed on an outer side of the rear cover portion and that are connected to the gas supply blocks via through holes in the rear cover portion, and
   a gas supply unit connected to the gas supply pipes.

16. The wafer storage apparatus of claim 15, wherein the gas supply blocks are bars disposed on an inner front surface of the rear cover portion that extend from a bottom plate of the wafer stacking portion toward the upper cover.

17. The wafer storage apparatus of claim 15, wherein the gas supply block further comprises:
   a body portion, and
   a gas flow line formed within the body portion,
   wherein the plurality of gas spraying units are connected to the gas flow line.

* * * * *